United States Patent
Shah et al.

(10) Patent No.: US 12,412,771 B2
(45) Date of Patent: Sep. 9, 2025

(54) METHODS OF DETECTING PROCESS DEVIATIONS DURING MICROELECTRONIC DEVICE FABRICATION AND ASSOCIATED TAPES AND COMPONENTS

(71) Applicant: Micron Technology, Inc., Boise, ID (US)

(72) Inventors: Ankur Harish Shah, Singapore (SG); Venkateswarlu Bhavanasi, Singapore (SG); Wen How Sim, Singapore (SG); Harjashan Veer Singh, Taichung (TW)

(73) Assignee: Micron Technology, Inc., Boise, ID (US)

( * ) Notice: Subject to any disclaimer, the term of this patent is extended or adjusted under 35 U.S.C. 154(b) by 522 days.

(21) Appl. No.: 17/805,013

(22) Filed: Jun. 1, 2022

(65) Prior Publication Data
US 2023/0395419 A1   Dec. 7, 2023

(51) Int. Cl.
*H01L 21/683*   (2006.01)
*H01L 21/67*   (2006.01)
*H01L 21/78*   (2006.01)

(52) U.S. Cl.
CPC .... *H01L 21/6836* (2013.01); *H01L 21/67132* (2013.01); *H01L 21/7806* (2013.01);
(Continued)

(58) Field of Classification Search
CPC ........... H01L 21/6836; H01L 21/67132; H01L 21/7806; H01L 2221/68327;
(Continued)

(56) References Cited

U.S. PATENT DOCUMENTS

| | | | |
|---|---|---|---|
| 6,699,774 B2 * | 3/2004 | Takyu | H01L 21/78 438/460 |
| 7,897,488 B2 | 3/2011 | Watanabe et al. | |

(Continued)

OTHER PUBLICATIONS

Bovatsek et al., Highest-Speed Dicing of Thin Silicon Wafers with Nanosecond-Pulse 355nm Q-Switched Laser Source Using Line-Focus Fluence Optimization Technique, Proc. SPIE 7585, (Feb. 2010), 11 pages.

(Continued)

*Primary Examiner* — Vu A Vu
(74) *Attorney, Agent, or Firm* — TraskBritt

(57) ABSTRACT

Methods of identifying damaged microelectronic devices are described. A method includes applying a detection material to an active surface of a wafer. The detection material includes an additive configured to yield a visible reaction to heat or infrared or near-infrared light. The method may further include focusing a laser beam into an interior portion of the wafer through a second surface of the wafer opposite the active surface to form a modified layer along a separation region extending between adjacent microelectronic devices. The method may also include inspecting the detection material for visible reactions. The method may further include identifying reactions that indicate exposure to heat or infrared or near-infrared light over a pre-determined threshold. Protective tape, backgrind tapes, and methods of manufacturing a microelectronic device are also described.

24 Claims, 6 Drawing Sheets

(52) U.S. Cl.
CPC ............... *H01L 2221/68327* (2013.01); *H01L 2221/68386* (2013.01)

(58) Field of Classification Search
CPC .......... H01L 2221/68386; H01L 21/78; H01L 2221/6834
USPC ....................................................... 438/463
See application file for complete search history.

(56) References Cited

U.S. PATENT DOCUMENTS

| | | | |
|---|---|---|---|
| 8,084,334 B2 * | 12/2011 | Abe | H01L 21/565 438/464 |
| 8,507,363 B2 | 8/2013 | Lei et al. | |
| 8,541,251 B2 * | 9/2013 | Uchiyama | B23K 26/53 438/33 |
| 8,673,741 B2 | 3/2014 | Finn | |
| 8,800,475 B2 | 8/2014 | Finn | |
| 8,986,486 B2 * | 3/2015 | Takamoto | B32B 38/10 156/264 |
| 9,601,437 B2 | 3/2017 | Albermann et al. | |
| 10,438,898 B2 | 10/2019 | Nakamura et al. | |
| 10,586,746 B2 * | 3/2020 | Rusli | H01L 21/67242 |
| 10,607,861 B2 * | 3/2020 | Wongratanaporngoorn | H01L 21/67288 |
| 10,639,747 B2 * | 5/2020 | Inoue | H01L 21/78 |
| 10,745,592 B2 * | 8/2020 | Ahn | C09J 11/00 |
| 10,796,899 B2 | 10/2020 | Espina | |
| 2006/0280912 A1 * | 12/2006 | Liang | H01B 1/22 428/173 |
| 2011/0220268 A1 * | 9/2011 | Nishio | B32B 27/36 428/354 |
| 2014/0182786 A1 | 7/2014 | Finn | |
| 2017/0186730 A1 * | 6/2017 | Shen | H01L 21/76877 |
| 2018/0151370 A1 | 5/2018 | Bae | |

OTHER PUBLICATIONS

Cereno et al., Stealth Dicing Challenges for MEMS Wafer Applications, https://ieeexplore.ieee.org/document/7999716, (2017), 5 pages.

Luangpaiboon et al., Stealth Laser Dicing Process Improvement via Shuffled Frog Leaping Algorithm, World Academy of Science, Engineering and Technology International Journal of Computer and Information Engineering, vol. 8, No. 3, (2014), 4 pages.

* cited by examiner

METHODS OF DETECTING PROCESS DEVIATIONS DURING MICROELECTRONIC DEVICE FABRICATION AND ASSOCIATED TAPES AND COMPONENTS

TECHNICAL FIELD

Embodiments of the disclosure relate to methods of manufacturing microelectronic devices. Specifically, some embodiments relate to methods of separating wafers into microelectronic devices, methods of inspecting microelectronic devices, methods of identifying damaged microelectronic devices, and to related tapes and components.

BACKGROUND

Microelectronic devices (e.g., semiconductor dice) may be fabricated by selective deposition, removal and treatment of conductive, semiconductive and insulating materials on and over an active surface of a wafer. Hundreds or even thousands of microelectronic devices may be fabricated in an array of rows and columns of microelectronic device locations on a single wafer. After the microelectronic devices are fabricated on the wafer the wafer may be separated, also characterized as "singulated" into individual microelectronic devices along scribe lines (e.g., streets) defined between the individual microelectronic device locations.

Microelectronic devices are commonly used in consumer electronics such as cell phones, tablets, computers, laptops, etc., as well as in servers and in automotive and industrial applications. As consumer electronic manufacturers continue to produce smaller and thinner versions of consumer electronics while demanding greater performance and enhanced circuit density, microelectronic devices have become smaller and thinner to accommodate these requirements. However, as microelectronic devices have become smaller and thinner, irregularities introduced at and near the edges of the microelectronic devices along the scribe lines during the separation process have become a significant issue in terms of yield and mortality. This issue arises in part due to the introduction of low k (k 1) dielectric materials to enhance scaling of integrated circuitry as conductors and components have become smaller, thinner and ever-closer to one another.

Conventional insulating dielectrics such as silicon dioxide cannot be sufficiently thin without charge buildup and crosstalk. On the other hand, low k dielectrics of desirable thinness reduce parasitic capacitance, eliminate crosstalk and enable faster switching speeds. However, polymeric low-k dielectrics commonly employed, such as polyimides, polynorbornenes, bencyclobutene (BCB) and polytetrafluoroethylene (PTFE), suffer from low mechanical strength, coefficient of thermal expansion (CTE) mismatch with other materials of the microelectronic device, and lack of thermal stability.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

Figure 1A:
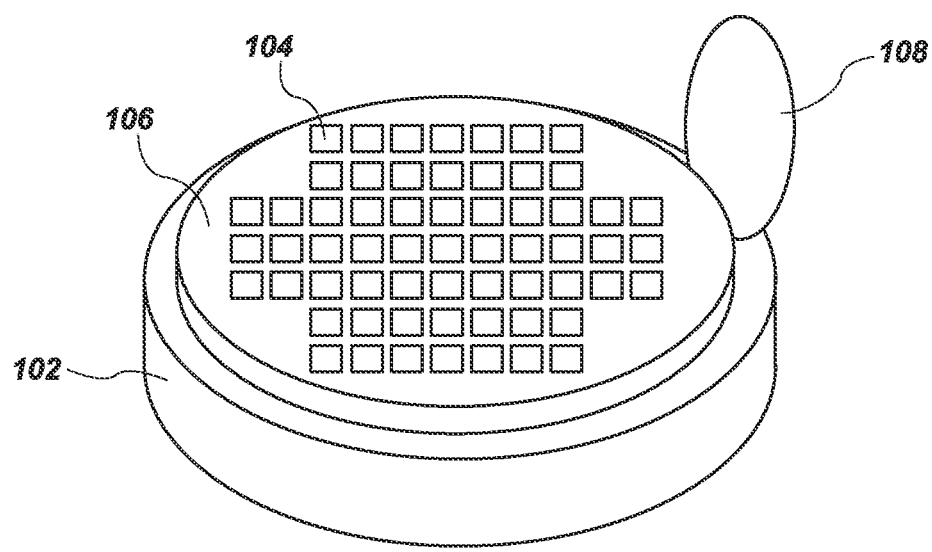
FIGS. 1A and 1B are schematic views of a conventional semiconductor wafer during an edge trim process preliminary to processes according to embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "configured" and "configuration" refers to a size, a shape, a material composition, a material distribution, orientation, and arrangement of at least one feature (e.g., one or more of at least one structure, at least one material, at least one region, at least one device) facilitating use of the at least one feature in a pre-determined way.

As used herein, the term "substantially" in reference to a given parameter means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, relational terms, such as "beneath," "below," "lower," "bottom," "above," "upper," "top," "front," "rear," "left," "right," and the like, may be used for ease of description to describe one element's or feature's relationship to another element(s) or feature(s) as illustrated in the drawings. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" means and includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

Microelectronic devices in the form of semiconductor dice are conventionally fabricated on wafers of semiconductor material, most commonly silicon. Microelectronic devices may be manufactured by selective deposition, removal and treatment of conductive, semiconductive and insulating materials on and over an active surface of a wafer in a repeating pattern corresponding to locations for the microelectronic devices. For example, a microelectronic device may include multiple layers of such materials in predetermined patterns forming integrated circuitry on the active surface of a wafer. After circuitry for the microelectronic devices is completed, the wafer may be thinned by removing material from a back side of the wafer opposite the active surface, and the wafer may then be separated into individual microelectronic devices through a dicing process.

As microelectronic devices and material layers thereof become thinner and more fragile, new methods and tooling may be required to successfully thin and singulate the wafers without damaging the individual microelectronic devices. For example, singulation processes that leave a rough finishing edge such as laser groove dicing may result in reduced microelectronic device yield and quality, due to irregularities in the finishing edge of a singulated device, which irregularities may propagate into the device. One process that may be used to separate the microelectronic devices from the wafer without producing rough finishing edges is a so-called Stealth Dicing Before Grind (SDBG) process.

A conventional SDBG process may include focusing a laser beam in an interior portion of a wafer to form a weakened region (e.g., modified layer) of the wafer that may propagate into controlled cracks along areas where the wafer may be separated into individual microelectronic devices. In some embodiments, some of the energy from the laser beam may travel beyond the weakened region. For example, some of the energy of the laser beam may not be absorbed by the wafer in the weakened region. The energy that is not absorbed may continue to travel through the wafer, both in the direction of the laser beam and laterally. The energy may contact an active surface of the wafer and/or circuitry of the microelectronic devices on the active surface of the wafer. In some instances, the energy may be sufficient to cause defects in the circuitry, such as delaminations, melted connections, damaged components, etc. Defects caused by the residual energy may be difficult to detect. For example, defects may not be discovered until final testing of the microelectronic devices. In some instances, the defects may weaken the connections within the microelectronic devices such that the microelectronic devices pass final testing and experience premature failures when operating in a final product. Developing materials and methods for detecting locations where residual energy has passed to the active surface of the wafer may facilitate the removal of individual failed dice and/or dice that are likely to fail prematurely before they are placed in a larger microelectronic device, component, or system.

With reference to FIGS. 1A-9, individual acts of fabricating microelectronic devices including acts preliminary to an SDBG process are described. For example, FIG. 1A depicts an unthinned semiconductor (e.g., silicon) wafer 102 during a conventional edge trim process, which may be employed prior to an SDBG process, wherein a peripheral edge of the unthinned semiconductor (e.g., silicon) wafer 102, having a thickness of, for example, about 600 μm to about 800 μm and having integrated circuitry layers 104 on an active surface 106 thereof, is trimmed in a so-called "edge trim" process to reduce potential edge damage issues during subsequent wafer thinning using a blade 108 to a depth approximating a final, reduced thickness of wafer 102 plus a selected margin. FIG. 1B is an enlarged schematic cross-sectional view of a portion of wafer 102 being trimmed by blade 108.

Figure 1B:
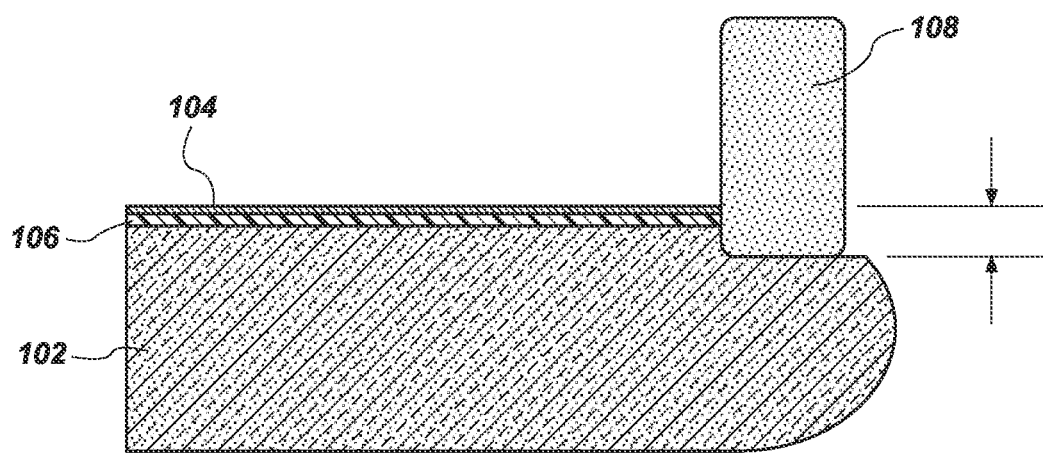
Figure 2:
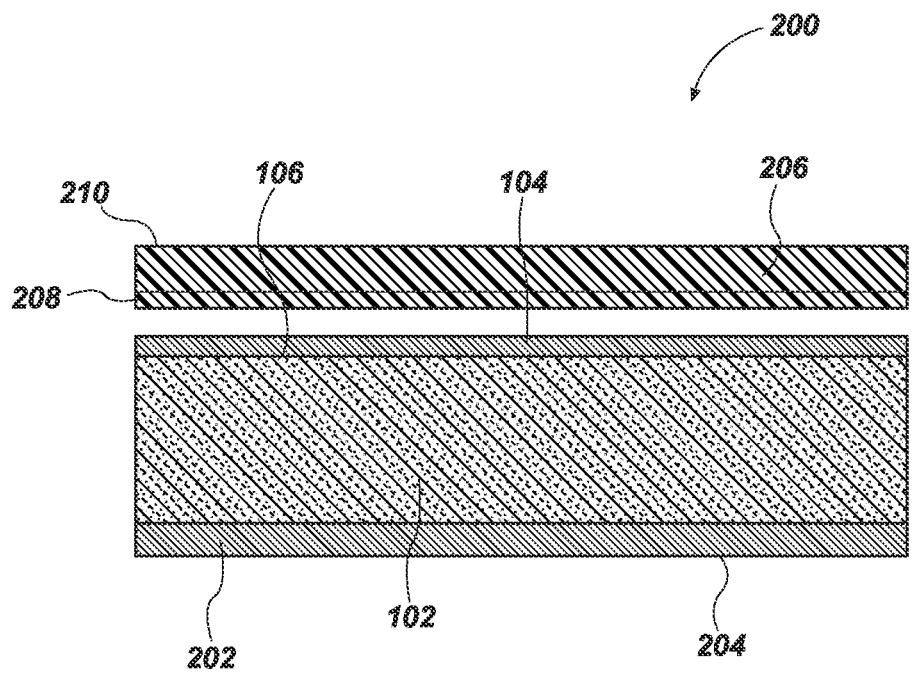
FIG. 2 illustrates a schematic view of a portion of a microelectronic device during a microelectronic device fabrication sequence after edge trim and in accordance with an embodiment of the present disclosure.

With reference to FIG. 2, a tape lamination process 200 is described, wherein the wafer 102 edge trimmed in accordance with FIGS. 1A and 1B may have circuitry layers 104 formed in an array of microelectronic device locations on an active surface 106 of the wafer 102. For simplicity of illustration, the edge of the full-thickness wafer 102 laterally beyond the microelectronic device locations has been omitted. Once the integrated circuitry layers 104 are formed over the wafer 102, a protective tape 206 (e.g., backgrind tape) may be applied over the integrated circuitry layers 104 in the tape lamination process 200. The protective tape 206 may be configured to protect the circuitry layers 104 of the wafer 102 during the subsequent processing, including removal of semiconductor material from a back side 204 of the wafer 102. The back side 204 of the wafer 102 may include an oxidation layer 202. In some embodiments, the oxidation layer 202 may be configured as a cover layer to protect the wafer 102 from corrosion.

The protective tape 206 may include an adhesive layer 208 and a protective layer 210. The adhesive layer 208 may be formed from an adhesive material, such as a glue, an acrylic, or an epoxy. In some embodiments, the adhesive material may be configured to break down when exposed to specific types of light, chemicals, and/or heat to substantially prevent damage when the protective tape 206 is removed in a later step. For example, the adhesive material may be configured to break down when exposed to UV light or become softer losing adhesiveness when heated to a high temperature. The adhesive layer 208 may be positioned proximate the circuitry layers 104. The protective layer 210 may be formed from a flexible backing material, such as polyvinyl chloride (PVC), polyethylene terephthalate (PET) or polyolefin.

In some embodiments, the protective tape 206 may be configured to generate a visible reaction when the protective tape 206 is exposed to specific wavelengths of light, such as infrared (IR) wavelengths of light (e.g., in the range from about 780 nm to about 1 mm) or near to medium IR wavelengths of light (e.g., in the range from about 800 nm to about 2,500 nm). For example, the protective tape 206 may include nano-particles disposed within the protective tape 206 that are configured to generate a visible reaction to IR or near-IR wavelengths of light. The nano-particles may have major dimensions (e.g., length, diameter, height, apothem, etc.) less than about 100 nm, such as in the range from about 1 nm to about 50 nm, or from about 5 nm to about 20 nm. Nano-particles, such as $NaYF_4Yb,Er$, $NaREF_4$, $Y_2O_3$:Er,Tm,Ho, $La_2O_3$:Er, and/or $Gd_2O_2S$:Yb,Er, and photon-conversion-susceptible nano-particles may yield a color change in adhesive material 208 of the protective tape 206 when they absorb IR or near-IR wavelengths and emit different wavelengths such as blue light in the UV region which may react with additives in the protective tape 206 to induce color change. Furthermore, the color yielded by the nano-particles in protective tape 206 may be defined by the amount of IR or near-IR light that they absorb. Thus, the area of color change yielded by the nano-particles may provide a visible reaction that can be interpreted to determine if IR or near-IR light contacted the protective tape 206 in a given location as well as how much IR or near-IR light was absorbed by the protective tape 206. In another example, the protective tape 206 may include a dye, such as an organic dye or a polymeric dye that may change color and may vary in color intensity in response to a degree of exposure to IR or near-IR wavelengths of light. Dyes such as leuco dyes, photochromic dyes, fluorescent dyes, and/or fluorophore chemical additives may change color and color intensity when they interact with the generated wavelength of the additive particles upon interaction with IR or near-IR light. Similar to the nano-particles, the change in color intensity of the dye may serve as a visual indication that the protective tape 206 was exposed to IR or near-IR light.

In other embodiments, the protective tape 206 may be configured to generate a visible reaction when the protective tape 206 is exposed to heat. For example, nano-particles, such as Gold, Magnetic Iron ($Fe_3O_4$), Silver, Copper, or Carbon Black undergo plasmonic resonance and generate a rise in temperature releasing thermal energy or radiation when they absorb IR or near-IR light. The rise in temperature may cause a visible reaction in the protective tape 206, such as a color change. For example, the protective tape 206 may include temperature sensitive dyes that may change color when exposed to heat. Dyes, such as leuco dyes, fluorescent dyes, and/or fluorophore chemical additives may change color when they absorb heat. Thus, the heat generated by the nano-particles may cause the heat sensitive dye to change color and the change in color intensity of the dye may serve as a visual indication of the degree to which the protective tape 206 was exposed to IR or near-IR light.

In some embodiments, the nano-particles and/or dyes may be disposed in the adhesive layer 208 of the protective tape 206. For example, the adhesive material of the adhesive layer 208 may be manufactured to include the nano-particles and/or dyes in the adhesive material. In other examples, the nano-particles and/or dyes may be applied to an outer surface of the adhesive layer 208, such as through a spraying process, prior to the protective tape 206 being applied to over the circuitry layers 104 of the wafer 102. In some embodiments, the nano-particles and/or dyes may be disposed in the protective layer 210 of the protective tape 206. For example, the flexible backing material may be manufactured to include the nano-particles and/or dyes dispersed throughout the flexible backing material. The concentrations of the nano-particles may be less than about 1% of the respective adhesive layer 208 or protective layer 210, such that the material properties of the respective adhesive layer 208 or protective layer 210 may remain substantially the same.

Thus, embodiments of the disclosure may include a protective tape. The protective tape may include a backing material and an adhesive material. The protective tape may further include a concentration of nano-particles disposed within at least one of the backing material and the adhesive material. The nano-particles may be configured to yield a visible reaction to exposure to infrared light or heat.

Another embodiment of the disclosure may include a backgrind tape. The backgrind tape may include an adhesive layer forming a first surface of the backgrind tape. The backgrind tape may further include a protective layer forming a second surface opposite the first surface of the backgrind tape. The backgrind tape may also include an additive disposed in at least one of the adhesive layer and the protective layer, the additive configured to produce a visible reaction responsive to exposure to infrared light.

Figure 3:
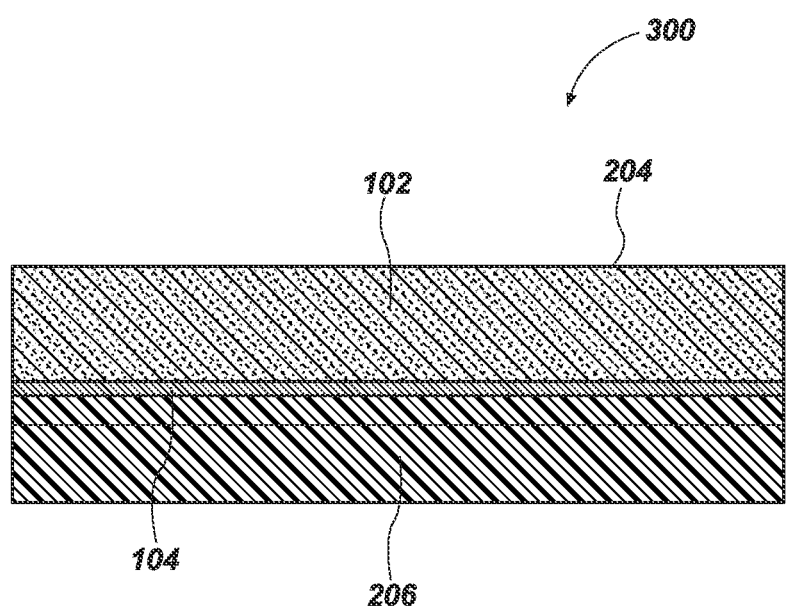
FIG. 3 illustrates a schematic view of a portion of a microelectronic device during a microelectronic device fabrication sequence after edge trim and in accordance with an embodiment of the present disclosure.

With reference to FIG. 3, a pre-thin process 300 is described. In the pre-thin process 300, once the protective tape 206 is applied over the integrated circuitry layers 104, the wafer 102 may be inverted such that the back side 204 of the wafer 102 is facing upward. In the pre-thin process 300 a portion of the wafer 102 such as the oxidation layer 202 (FIG. 2) or fab-based contamination on the exposed back side 204 may be removed and the surface roughness of the back side of the wafer 102 reduced to facilitate penetration of a laser beam into the wafer 102. After the pre-thin process 300, the wafer 102 may remain substantially thicker than a desired final thickness. The pre-thin process 300 may thin the wafer 102 by removing a relatively small thickness of material, such as, by way of example only, between about 10 µm and about 50 µm of material. The pre-thin process 300 may include a grinding or polishing process to remove the oxidized portion of material from the back side 204 of the wafer 102.

Figure 4:
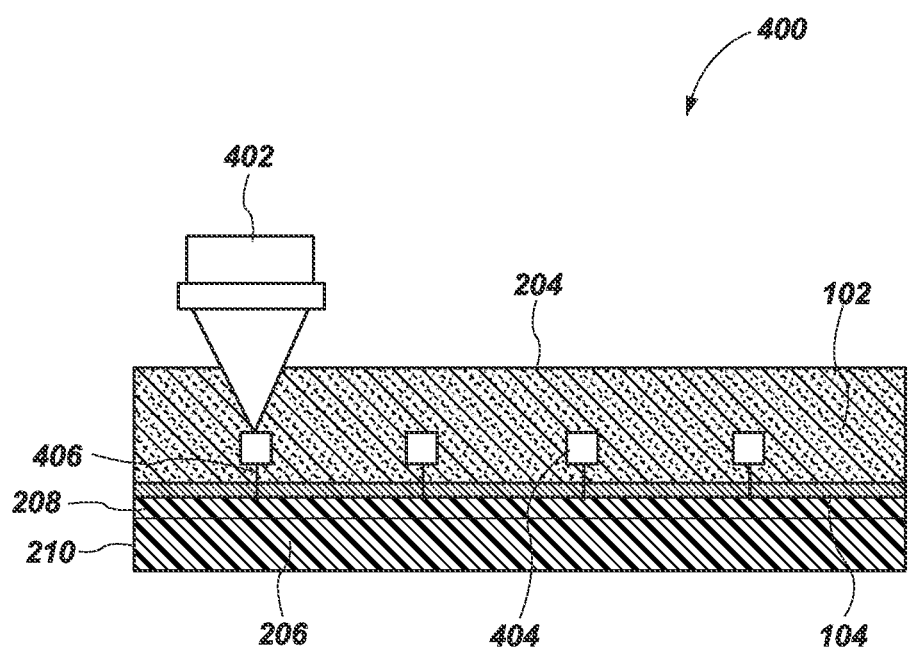
FIG. 4 illustrates a schematic view of a portion of a microelectronic device during a microelectronic device fabrication sequence after edge trim and in accordance with an embodiment of the present disclosure.

With reference to FIG. 4, an SDBG process 400 performed on the wafer 102 is described. The SDBG process 400 may include use of a laser beam 402 that is focused on an inner portion of the wafer 102. The laser beam 402 may enter the wafer 102 from the back side 204 of the wafer 102. The laser beam 402 may form, at its focal point, a modified layer 404 inside the wafer 102 comprising weakened regions within the wafer 102. For example, the modified layer 404 may be formed through a localized melting of the material of the body of the wafer 102 by the laser beam 402, which changes the crystalline structure of the wafer 102 at that location. The modified layer 404 may scan in a pattern corresponding with scribe lines corresponding to separation regions between adjacent microelectronic devices that may be defined in the circuitry layers 104.

The focal point of the laser beam 402 may be at a depth within the wafer 102 measured from the back side 204 of the wafer 102 of between about 50 µm and about 200 µm, such as between about 100 µm and about 150 µm. In some embodiments, the laser beam 402 may pass over the same region of the wafer 102 multiple times at different depths, such that the laser beam 402 forms multiple modified layers 404 at different depths. In some embodiments, the laser beam 402 may only pass over each region of the wafer 102 one time forming a single modified layer 404 at a single depth.

As discussed above, some of the light from the laser beam 402 may not be absorbed in the modified layer 404. The unabsorbed light or residual light may pass through the wafer 102 to the active surface and the wafer 102 and into the protective tape 206. The residual light may then be absorbed by the protective tape 206 and/or may generate heat, such as through plasmonic heat generation, that may be absorbed by the protective tape 206. In some instances, energy from the laser beam 402 may spread laterally from the path (i.e., scribe line 506, see FIG. 5) of the laser beam 402, in a phenomenon termed "splash." By way of example only, the splash region may be required to be plus or minus 30 µm laterally from the center of a scribe line for a scribe width of 80 µm to be confident of the absence of laser-induced damage to a microelectronic device area adjacent to the scribe line.

Figure 5:
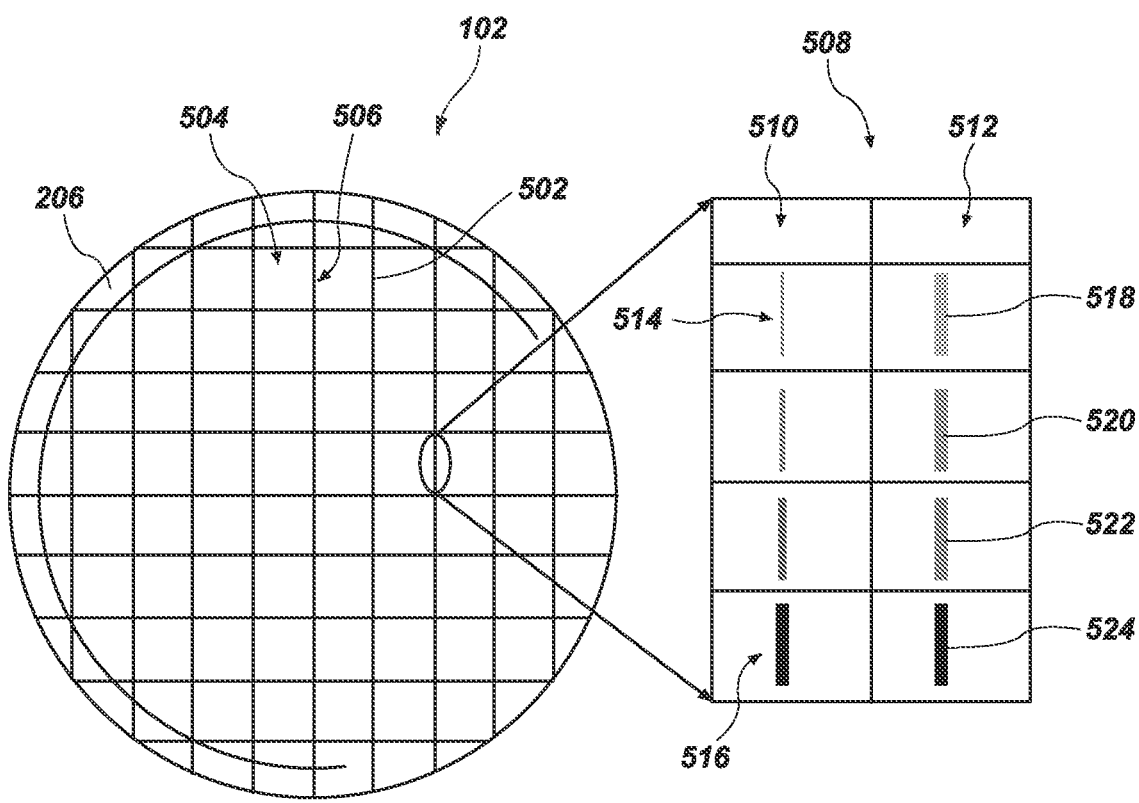
FIG. 5 illustrates a plan view of a wafer after the processing step illustrated in FIG. 4 in accordance with an embodiment of the present disclosure.

FIG. 5 illustrates a plan view of the active side of the wafer 102 with the protective tape 206 after an SDBG process 400. As illustrated, the protective tape 206 may include areas of visible reactions 502. The visible reactions 502 may substantially coincide with the scribe lines or separation regions 506 between individual microelectronic devices 504. As described above, the visible reaction 502 may be caused by nano-particles or dyes within the adhesive layer 208 (FIG. 2) or the protective layer 210 (FIG. 2) of the protective tape 206. The nano-particles cause a visible change in the protective tape 206 when they absorb thermal energy or light in the IR or near-IR spectrums.

A table 508 illustrates different reactions that may occur at different levels of exposure to heat or IR or near-IR light. For example, the column on the left side of table 508 illustrates visible reactions, such as boundary changes 510 that may occur when the nano-particles change color when exposed to heat or IR or near-IR light. A lateral thickness (i.e., width) of the reaction to sides of the scribe lines 506 may change between low exposure 514 and high exposure 516, such that a thicker line may indicate a higher level of exposure and greater extent of splash. Thus, a threshold amount of light exposure that is allowable may be determined and the corresponding acceptable threshold lateral thickness of the visible reaction 502 that occurs upon the threshold light exposure may also be determined. This may facilitate a user determining if the associated microelectronic devices bounded by the scribe lines 506 pass inspection by determining if the visible reaction 502 is less than or greater than the threshold lateral thickness. In some embodiments, the line width may indicate an area that was exposed rather than or in addition to an amount of exposure, such that the width of the line may indicate the size of the area where the residual light diffused laterally through the wafer 102 from the scribe line 506. Thus, a user may determine if the associated microelectronic device 504 is compromised by determining if residual light diffused or splashed through the wafer 102 in an area outside of the separation region 506 and in unacceptable proximity to circuitry on the active surface of a given microelectronic device 504.

The column on the right side of table 508 illustrates visible reactions, such as color changes 512. As described above, some dyes may change color when exposed to heat or IR or near-IR light. The color change 512 may also be dependent on the level of exposure. The table 508 illustrates the color changes 512 at four different levels of exposure. The level of exposure may determine the amount of damage that may be caused by the exposure and/or the distance from point of damage that damage may spread. For example, the first (i.e., top) row of the column on the right side of table 508 illustrates the color with no exposure 518 or in other words the beginning color of the protective tape 206. The second row of the column on the right side of table 508 illustrates the color intensity change 512 with minimal exposure 520, such as the amount of energy that would cause damage spreading less than about 5 µm from the point of exposure. The third row of the column on the right side of table 508 illustrates the color intensity change 512 with moderate exposure 522, such as the amount of energy that would cause damage spreading less than about 10 µm from the point of exposure or between about 5 µm and about 10 µm from the point of exposure. The final (i.e., bottom) row of the column of the right side of table 508 illustrates the color intensity change 512 associated with high exposure 524, such as a fatal exposure or exposure that is likely to cause damage spreading beyond the separation region 506 between the microelectronic devices 504 if the exposure is substantially aligned with the modified layer 404 (FIG. 4) and/or scribe lines in the separation region 506. If the damage is likely to spread beyond the separation region 506, the damage may spread into the circuitry layers 104 of the associated microelectronic devices 504 potentially causing immediate and/or premature operational failure of the associated microelectronic device 504.

The color change 512 may be a gradient type of color change moving from a light version of the associated color (e.g., cyan or pink) at the minimal exposure 520 to a darker version of the color (e.g., royal blue or deep red) at the high exposure 524. In other embodiments, the color change 512 may change between different colors. For example, the protective tape 206 may change to a first color, such as blue, at a minimal exposure 520 and may change to a completely different color, such as red, at the high exposure 524. In some cases, the moderate exposure 522 may be a mixture of the two different colors, such as purple for the exemplary colors used herein. In other cases, the moderate exposure 522 may be characterized by a third unrelated color, such as yellow. The color changes 512 may be defined by the type of nano-particles or dye used and/or the type of exposure (e.g., thermal or light) measured by the dyes.

In some embodiments, two different types of reactions may occur. For example, nano-particles exhibiting a boundary change 510 type of reaction may be disposed in the adhesive layer 208 (FIG. 2) and a dye exhibiting a color change 512 type of reaction may be disposed in the protective layer 210 (FIG. 2). Thus, a visual inspection may provide the user with both a size of the affected area and an amount of the exposure in each area. Automated optical inspection may be used to rapidly determine areas of probable damage to microelectronic devices adjacent the scribe lines based on one or more of width, color or color intensity of protective tape areas to sides of the scribe lines 506 based on one or more acceptable preprogrammed splash width thresholds, color change indicators, and color intensity thresholds.

The protective tape 206 may also provide a visual indication of areas where stray residual light splashed from the laser passes outside the separation region. For example, if some residual light passes through the circuitry layers 104 of one of the microelectronic devices 504 outside of the separation region 506, a color change of the protective tape 206 over the microelectronic device 504 may alert the user of the potential damage to the underlying microelectronic device 504.

Figure 6:
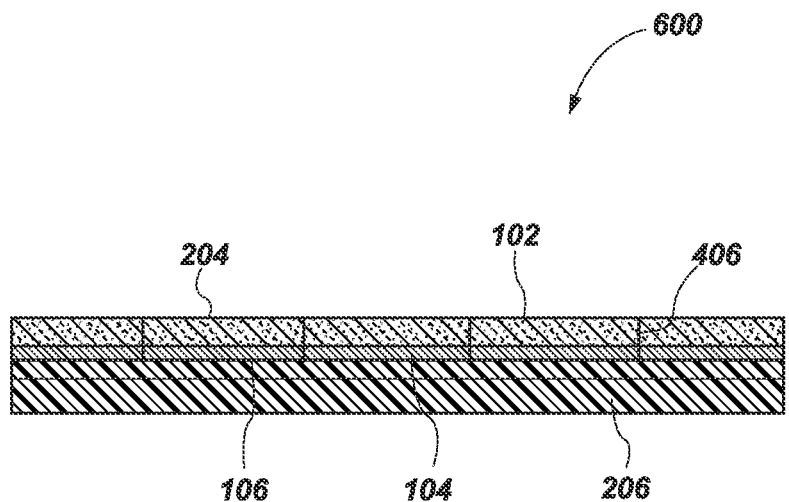
FIG. 6 illustrates a schematic view of a portion of a microelectronic device during a microelectronic device fabrication sequence after edge trim and in accordance with an embodiment of the present disclosure.

With reference to FIG. 6, after the SDBG process 400, the back side 204 of the wafer 102 may be thinned to a desired thickness in a thinning process 600. The back side 204 of the wafer 102 may be thinned through a grinding process, optionally followed by a polishing process or a wet etch, to a thickness of, for example, between about 50 μm and about 500 μm. As the wafer 102 is thinned, the modified layer 404 (FIG. 4) may introduce controlled cracks 406 in the wafer 102 and between the circuitry layers 104 of the microelectronic device locations responsive to applied force of the grinding process and associated vibrations in the material of the wafer 102. The cracks 406 may originate in the modified layer 404 and extend substantially through the wafer 102 into and through the active surface 106 along locations between the circuitry layers 104 of the respective microelectronic device location. In some embodiments, the thinning process 600 may substantially remove the modified layer 404.

In some embodiments, the wafer 102 may not be thinned in a post-SDBG thinning process 600. For example, the wafer 102 may be thinned to the desired thickness in a pre-thin process, such as a pre-thin process described above with reference to FIG. 3. The cracks 406 may form from the modified layer 404 through residual stresses in the wafer 102 rather than through a thinning process 600. For example, as discussed above, multiple modified layers 404 may be formed, such that residual stresses may extend the cracks 406 through a thicker wafer. In some embodiments, the wafer 102 may be thinned through a pre-thin process 300 to a smaller thickness, such as between about 50 μm and about 100 μm, such that the residual stresses are sufficient to carry the cracks 406 through the wafer 102 without thinning the wafer 102 in the post-SDBG thinning process 600.

Figure 7:
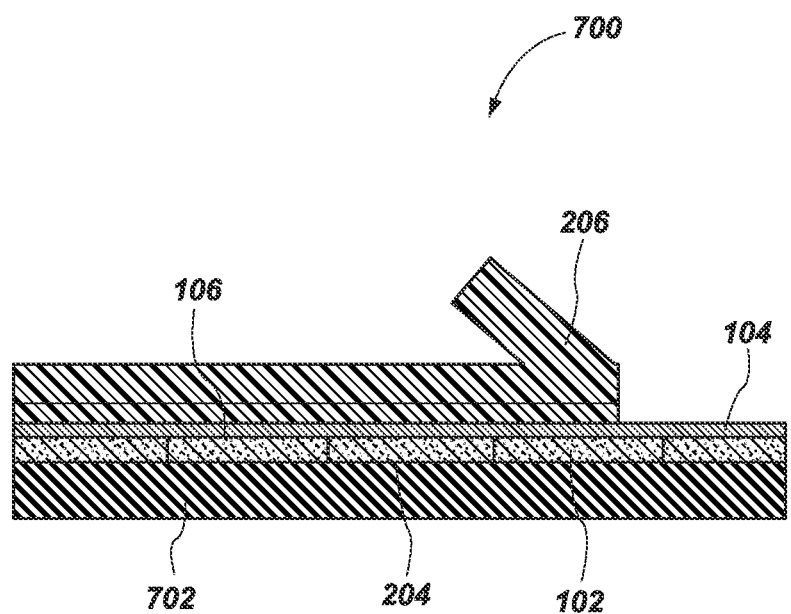
FIG. 7 illustrates a schematic view of a portion of a microelectronic device during a microelectronic device fabrication sequence after edge trim and in accordance with an embodiment of the present disclosure.

With reference to FIG. 7, a tape peeling process 700 is described. In the tape peeling process 700, after the cracks 406 have formed in the wafer 102, the wafer 102 may be inverted such that the active surface 106 is facing upward. The back side 204 of the wafer 102 may be mounted to a die attach film 702 and the protective tape 206 may be removed (i.e., peeled) from the circuitry layers 104 in a mounting and tape peeling process 700. If any of the microelectronic devices 504 were identified as likely sustaining damage during the visual inspection of the protective tape 206, the associated microelectronic devices 504 may be marked for removal before the protective tape 206 is removed.

Figure 8:
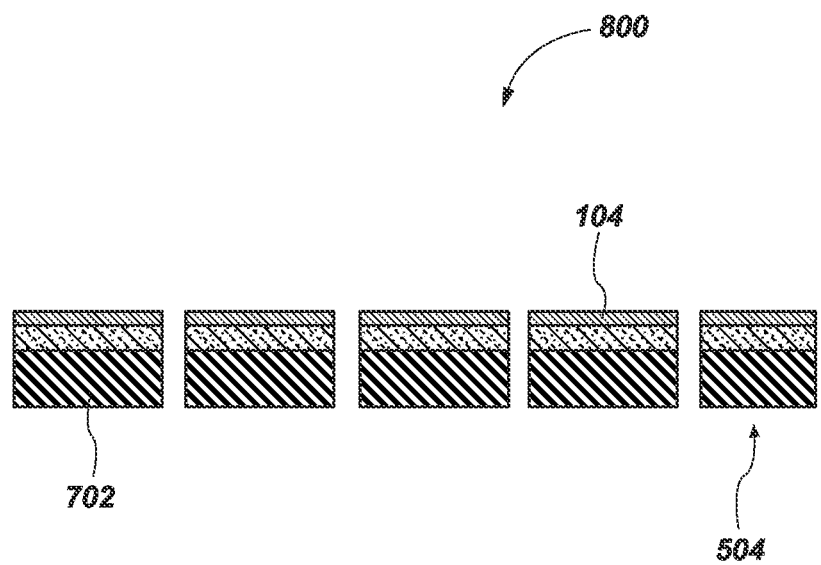
FIG. 8 illustrates a schematic view of a portion of a microelectronic device during a microelectronic device fabrication sequence after edge trim and in accordance with an embodiment of the present disclosure.

After the mounting and tape peeling process 700, the wafer 102 may be separated into microelectronic devices 504 in a die separation process 800. With reference to FIG. 8, in the die separation process 800, the die attach film 702 carrying the wafer 102 may be mounted to a table or chuck that may be configured to apply a radially directed force to the wafer 102 through stretching of the die attach film 702 such that the microelectronic devices 504 separate along the cracks 406 formed through the SDBG process. The microelectronic devices 504 identified as likely sustaining damage during the visual inspection of the protective tape 206 may be removed and discarded.

Thus, embodiments of the disclosure may include a method of manufacturing a microelectronic device. The method may include applying a backgrind tape to an active surface of the wafer. The backgrind tape may include at least one additive configured to promote a visible reaction to exposure to infrared or near-infrared light. The method may further include forming a modified layer along a separation region extending between adjacent microelectronic devices by focusing a laser beam into an interior portion of the wafer through a second surface of the wafer opposite the active surface. The method may also include inspecting the backgrind tape for areas if visible reactions responsive to exposure of the at least one additive to the infrared or near-infrared light. The method may further include separating the wafer along the separation region to form separate microelectronic devices.

Another embodiment of the disclosure may include a method of identifying damaged microelectronic devices. The method may include applying a detection material to an active surface of a wafer. The detection material may include thermally reactive nano-particles. The method may further include focusing a laser beam into an interior portion of the wafer through a second surface of the wafer opposite the active surface to form a modified layer along a separation region extending between adjacent microelectronic devices.

The method may also include inspecting the detection material for visible thermal reactions. The method may further include identifying thermal reactions that indicate exposure to heat over a pre-determined threshold.

Figure 9:
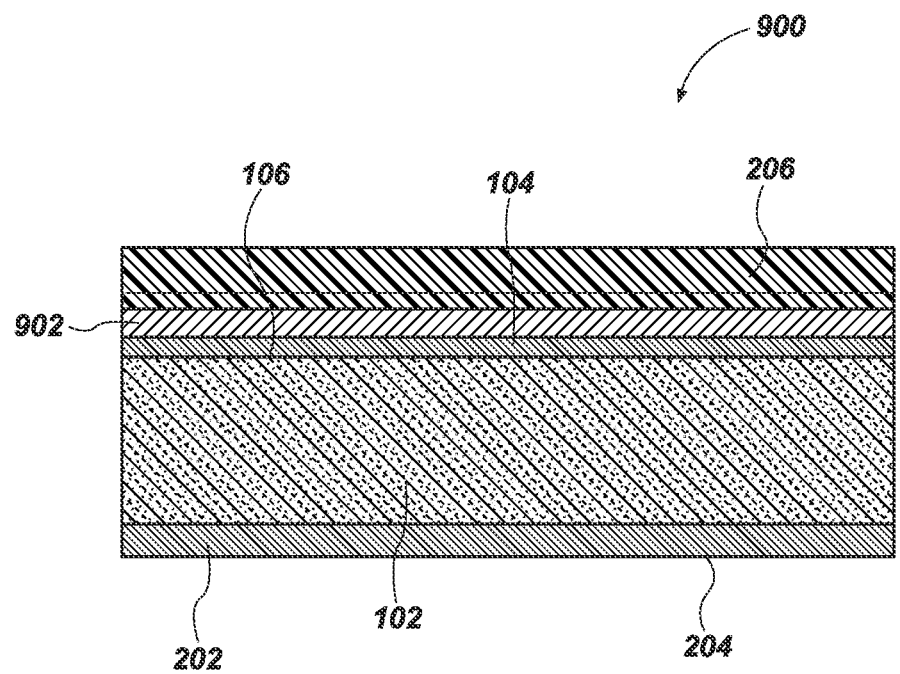
FIG. 9 illustrates a schematic view of a portion of a microelectronic device during a microelectronic device fabrication sequence after edge trim and in accordance with an embodiment of the present disclosure.

With reference to FIG. 9, an example of a tape lamination process 900, which is similar to the tape lamination process 200 described with reference to FIG. 2, is described. In the tape lamination process 900, an additional detection layer 902 is positioned between the protective tape 206 and the circuitry layers 104. The detection layer 902 may be configured to exhibit a visible reaction when exposed to heat, IR light, or near-IR light. For example, the detection layer 902 may be an adhesive including nano-particles and/or dyes disposed throughout the detection layer 902. The nano-particles and/or dyes may be configured to create a visible reaction, such as a color or color intensity change when they absorb heat, IR light, or near-IR light, similar to the nano-particles described above.

In some embodiments, the detection layer 902 may be applied to the active surface 106 of the wafer 102 separate from the protective tape 206, such as in a separate step. In other embodiments, the detection layer 902 may be applied to the protective tape 206 prior to the protective tape 206 being applied to the active surface 106 of the wafer 102. The detection layer 902 may be deposited as a liquid or gel, such as through a spraying process. In other embodiments, the detection layer 902 may be formed into a flexible material, such as a tape, which may be applied to the active surface 106 of the wafer 102.

In some embodiments, the detection layer 902 may be used instead of a protective tape 206 configured to generate a visible reaction. In other embodiments, both the detection layer 902 and the protective tape 206 may be configured to generate a visible reaction, such that the combination of the detection layer 902 and the protective tape 206 may generate multiple different visible reactions, such as two visible reactions, three visible reactions, four visible reactions or more.

The embodiments of the present disclosure may facilitate identifying microelectronic devices that are damaged or potentially damaged by residual light from a laser beam used in an SDBG process before the microelectronic devices are separated from the associated wafer. Identifying the damaged or potentially damaged microelectronic devices at an early stage may decrease the number of microelectronic components, such as semiconductor packages, die stacks, etc., that fail during testing or fail prematurely due to damage caused during the SDBG process. Thus, identifying and removing damaged or potentially damaged microelectronic devices at an early stage may increase the yield of final microelectronic devices and the reliability of the final microelectronic devices.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of manufacturing a microelectronic device comprising:

applying a backgrind tape to an active surface of a wafer, the backgrind tape including at least one additive configured to promote a visible reaction to exposure to infrared or near-infrared light;

forming a modified layer along a separation region extending between adjacent microelectronic device by focusing a laser beam into an interior portion of the wafer through a second surface of the wafer opposite the active surface;

inspecting the backgrind tape for areas of visible reaction responsive to exposure of the at least one additive to the infrared or near-infrared light; and separating the wafer along the separation region to form separate microelectronic devices.

2. The method of claim 1, further comprising discarding microelectronic devices indicated by a visible reaction to have one or more peripheral areas exposed to potentially damaging amounts of infrared light.

3. The method of claim 2, further comprising after inspecting the backgrind tape for the visible reaction, identifying the microelectronic devices exposed to potentially damaging amounts of infrared or near-infrared light by identifying microelectronic devices having exposure to infrared light over a pre-determined color or color intensity threshold.

4. The method of claim 2, further comprising after inspecting the backgrind tape for visible reactions, identifying the microelectronic devices exposed to potentially damaging amounts of infrared or near-infrared light by identifying microelectronic devices having exposure to infrared or near-infrared light laterally beyond a center line of the separation region.

5. The method of claim 1, wherein applying the backgrind tape comprises applying the backgrind tape including nano-particles.

6. The method of claim 5, wherein applying the backgrind tape including the nano-particles comprises applying the backgrind tape including photon-conversion susceptible or plasmonic nano-particles.

7. The method of claim 1, wherein applying the backgrind tape comprises applying the backgrind tape wherein the at least one additive comprises a dye.

8. The method of claim 1, wherein inspecting the backgrind tape for reactions comprises inspecting the backgrind tape for a change in color or color intensity.

9. The method of claim 8, wherein a color change or change in color intensity is indicative of an amount of exposure to the infrared or near-infrared light.

10. A method of identifying damaged microelectronic devices comprising:

applying a detection material to an active surface of a wafer, the detection material including thermally reactive nano-particles;

focusing a laser beam into an interior portion of the wafer through a second surface of the wafer opposite the active surface to form a modified layer along a separation region extending between adjacent microelectronic devices;

inspecting the detection material for visible thermal reactions; and identifying thermal reactions that indicate exposure to heat over a pre-determined threshold.

11. The method of claim 10, wherein applying the detection material comprises applying a protective tape.

12. The method of claim 11, wherein applying the detection material comprises applying an adhesive layer of the protective tape.

13. The method of claim 11, wherein applying the detection material comprises applying a protective layer of the protective tape.

14. The method of claim 10, wherein applying the detection material comprises applying the detection material as a liquid.

15. The method of claim 10, wherein identifying the thermal reactions comprises identifying a change in at least one of color or color intensity in the detection material.

16. The method of claim 15, wherein a change in color or color intensity is responsive to an amount of heat absorbed by the detection material.

17. A protective tape comprising:
a backing material;
an adhesive material; and
a concentration of nano-particles disposed within at least one of the backing material and the adhesive material, the nano-particles configured to yield a visible reaction, including a change in color, to exposure to infrared or near-infrared light, or heat.

18. The protective tape of claim 17, wherein the nano-particles comprise photon conversion-susceptible or plasmonic nano-particles.

19. The protective tape of claim 17, wherein the nano-particles comprise less than approximately 1% of the at least one of the backing material and the adhesive material.

20. The protective tape of claim 17, wherein the nano-particles have a major dimension between approximately 5 nm and approximately 20 nm.

21. The protective tape of claim 17, further comprising:
a first concentration of nano-particles disposed in the adhesive material, the first concentration of nano-particles configured to yield a first visible reaction to infrared or near-infrared light; and
a second concentration of nano-particles disposed in the backing material, the second concentration of nano-particles configured to yield a second visible reaction to heat different from the first visible reaction.

22. A backgrind tape comprising:
an adhesive layer forming a first surface of the backgrind tape;
a protective layer forming a second surface opposite the first surface of the backgrind tape; and
an additive disposed in at least one of the adhesive layer and the protective layer, the additive configured to produce a visible reaction including a change in optical properties of the additive responsive to exposure to infrared or near-infrared light.

23. The backgrind tape of claim 22, wherein the additive comprises a dye.

24. The backgrind tape of claim 22, wherein the additive comprises a concentration of nano-particles.

* * * * *